United States Patent
Nakamura

(10) Patent No.: US 11,013,122 B2
(45) Date of Patent: May 18, 2021

(54) ELECTRICAL CONNECTION STRUCTURE FOR WIRING BOARDS AND DISPLAY DEVICE

(71) Applicant: SAKAI DISPLAY PRODUCTS CORPORATION, Sakai (JP)

(72) Inventor: Shinichi Nakamura, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/962,200

(22) PCT Filed: Jan. 24, 2018

(86) PCT No.: PCT/JP2018/002085
§ 371 (c)(1),
(2) Date: Jul. 14, 2020

(87) PCT Pub. No.: WO2019/146011
PCT Pub. Date: Aug. 1, 2019

(65) Prior Publication Data
US 2021/0059053 A1    Feb. 25, 2021

(51) Int. Cl.
H05K 1/14    (2006.01)
H05K 1/18    (2006.01)
H01R 12/65    (2011.01)

(52) U.S. Cl.
CPC ............. *H05K 1/189* (2013.01); *H01R 12/65* (2013.01); *H05K 1/142* (2013.01); *H05K 2201/10136* (2013.01); *H05K 2201/10189* (2013.01)

(58) Field of Classification Search
CPC ................................................. H05K 1/14–148
See application file for complete search history.

(56) References Cited

FOREIGN PATENT DOCUMENTS

JP    2007-134357 A    5/2007

*Primary Examiner* — Jeremy C Norris
(74) *Attorney, Agent, or Firm* — ScienBiziP, P.C.

(57) ABSTRACT

This electrical connection structure for wiring boards comprises: a plurality of wiring boards which are arranged along one side of a display panel and distribute electric power and/or an electric signal for driving the display panel; and a connector which is mounted on the wiring boards adjacent to each other, and electrically connects the wiring boards via a belt-like wiring material. Terminal connecting region and connector fixing region of the wiring board are configured to enable both first mounting of the connector with a direction in which the belt-like wiring material is inserted from the display panel end and second mounting of the connector with a direction in which the belt-like wiring material is inserted from an end opposite to the display panel. Thus, the present invention provides an electrical connection structure for wiring boards, in which an insertion direction of a connector can be reversed.

9 Claims, 13 Drawing Sheets

ELECTRICAL CONNECTION STRUCTURE FOR WIRING BOARDS AND DISPLAY DEVICE

TECHNICAL FIELD

The present invention relates to an electrical connection structure for a wiring board, and a display apparatus.

BACKGROUND ART

Conventionally, as an electrical connection structure for a wiring board, there is a structure comprises a printed wiring board to distribute an electric signal and/or power to a plurality of TCPs (Tape carrier packages) on which a driver to drive a liquid crystal display panel is mounted (see JP 2007-134357 A (Patent Document 1), for example.

PRIOR ART DOCUMENT

Patent Document
   Patent Document 1: JP 2007-134357 A

SUMMARY OF THE INVENTION

Problem to be Solved by the Invention

While, in an electrical connection structure for such a wiring board, it is necessary to increase dimensions of a printed wiring board in the longitudinal direction in conjunction with an increased panel size of a liquid crystal display panel, there are constraints related to alignment accuracy and manufacturing with respect to the dimensions of the printed wiring board in the longitudinal direction.

Therefore, in a large liquid crystal display panel, a plurality of printed wiring boards are used and the printed wiring boards are electrically connected with each other via a FPC (Flexible printed circuit: flexible wiring board). The FPC to connect between the printed wiring boards has a U shape comprising a belt-like base portion, and two projecting portions extending in a direction being orthogonal to the longitudinal direction of the base portion from the opposite ends, respectively, of the base portion, for example.

For example, in a liquid crystal display panel according to the flat panel specification having a panel surface being planar, the FPC to connect between the printed wiring boards is preferably arranged such that the base portion overlaps the printed wiring boards. This is to save space. On the other hand, in a liquid crystal display panel according to the curved panel specification having a panel surface being curved, the FPC to connect between the printed wiring boards is preferably arranged such that the base portion does not overlap the printed wiring boards. This is to ensure that the FPC being curved along the panel surface do not interfere with the printed wiring boards and that a large stress be not applied onto the FPC.

In this way, while the preferable position of the FPC relative to the printed wiring boards differs between the flat panel specification and the curved panel specification, it is necessary to change the mounting orientation, to the printed wiring boards, of the connecter to which the FPC is connected in order to change the position of the FPC relative to the printed wiring boards. However, in a case that one seeks to make a plurality of types of printed wiring boards having different mounting orientations of the connector according to the specifications of the liquid crystal display panel, there is a problem that cost increases as a printed wiring board needs to be designed and developed for each thereof.

Thus, a problem to be solved by the present invention is to provide an electrical connection structure for a wiring board in which the inserting direction to a connector can be reversed by providing a wiring board in which the mounting orientation of the connector can be changed, and a display apparatus comprising such an electrical connection structure for the wiring board.

Means to Solve the Problem

An electrical connection structure for a wiring board according to one aspect of the present invention comprises a plurality of wiring boards to distribute an electrical signal and/or power to drive a display panel, the plurality of wiring boards being arranged along one side of the display panel; and connectors being mounted to mutually neighboring wiring boards, respectively, of the plurality of wiring boards to electrically connect between the wiring boards via a belt-like wiring material, wherein the connector comprises:

a connector body with an elongated shape having a longitudinal direction along an arrangement direction of the plurality of wiring boards;

a plurality of terminals being arranged in the connector body along the longitudinal direction; and connector fixing terminals being provided at opposite ends of the connector body in the longitudinal direction, the wiring board comprises:

a terminal connecting region to which the plurality of terminals of the connector is connected; and a connector fixing region to which the connector fixing terminals at opposite ends of the connector are connected, and the terminal connecting region and the connector fixing region are configured to enable both of a first mounting of the connector and a second mounting of the connector, wherein the first mounting of the connector has an orientation in which an inserting direction of the belt-like wiring material is to be from a display panel end, and the second mounting of the connector has an orientation in which the inserting direction of the belt-like wiring material is to be from an end being opposite to the display panel.

Effects of the Invention

The present invention makes it possible to realize an electrical connection structure for a wiring board in which the inserting direction to a connector can be reversed by providing a wiring board in which the mounting orientation of the connector can be changed, and a display apparatus comprising such an electrical connection structure for the wiring board.

EMBODIMENT FOR CARRYING OUT THE INVENTION

Figure 1:
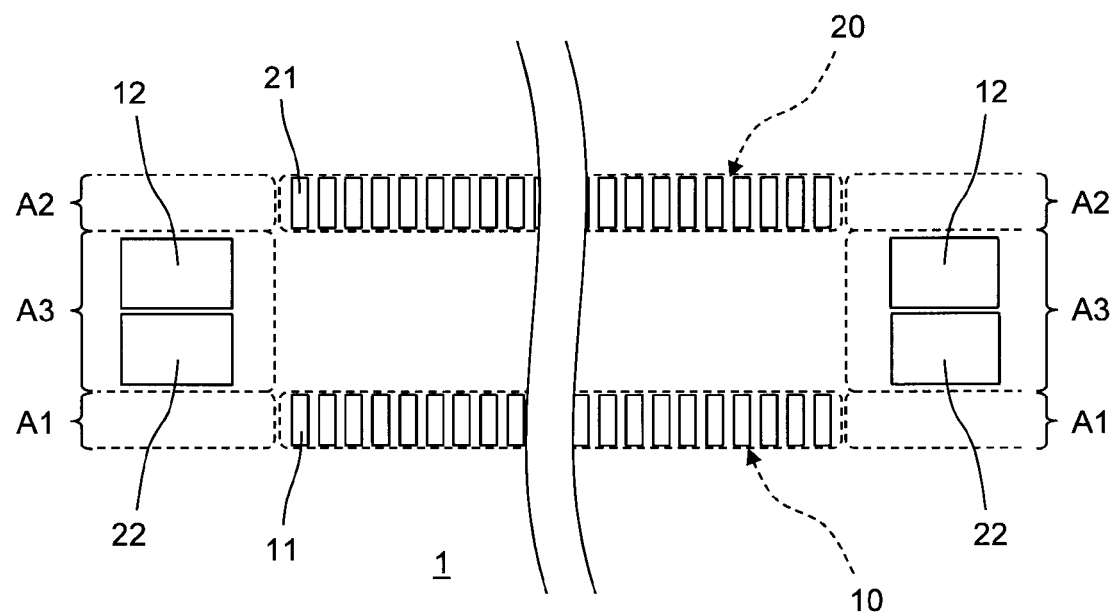
FIG. 1 shows a plan view of a main part of a printed wiring board to be used for an electrical connection structure for a wiring board according to a first embodiment of the present invention, to which main part a connector is to be mounted.

Below, an electrical connection structure for a wiring board and a display apparatus comprising the electrical connection structure for a wiring board of the present invention will be described in detail according to the embodiments illustrated. The same reference numeral is affixed to the same constituting elements through a plurality of drawings.

First Embodiment

FIG. 1 shows a plan view of a main part of a printed wiring board 1 to be used for an electrical connection structure for a wiring board according to a first embodiment of the present invention, to which main part a connector CN1 (shown in FIGS. 3 and 4) is to be mounted. In FIGS. 1 to 4, an upper portion in each drawing is to be the liquid crystal display panel end. Here, the liquid crystal display panel is one example of a display apparatus.

The printed wiring board 1 to be used for the electrical connection structure for the wiring board according to the first embodiment is arranged in a plurality along one side of a liquid crystal display panel 200, 300 (shown in FIGS. 5 and 7), and the plurality of printed wiring boards 1 distributes an electrical signal and power to drive the liquid crystal display panel 200, 300. Moreover, a connector CN1 (shown in FIG. 3) is mounted to each of mutually neighboring printed wiring boards 1 in the plurality of printed wiring boards 1 and the neighboring printed wiring boards 1 are electrically connected with each other via an FPC 50 (shown in FIG. 3) to be connected to the connector CN1.

As shown in FIG. 1, the printed wiring board 1 comprises a plurality of terminal connecting lands 11 being arranged along the longitudinal direction (the left right direction in the drawing) of the printed wiring board 1, and a plurality of terminal connecting lands 21 arranged along the longitudinal direction of the printed wiring board 1 so as to be parallel to the plurality of terminal connecting lands 11 with a predetermined interval, and connector fixing lands 12 and 22 to which connector fixing terminals 43 (shown in FIGS. 3 and 4) at the opposite ends of the connector CN1 are connected.

The plurality of terminal connecting lands 11 makes up a first terminal connecting region 10, while the plurality of terminal connecting lands 21 makes up a second terminal connecting region 20. The first terminal connecting region 10 and the second terminal connecting region 20 are arranged such that the positions at opposite ends of the first terminal connecting region 10 and the positions at opposite ends of the second terminal connecting region 20 face each other. A plurality of terminals 42 (shown in FIGS. 3 and 4) of the connector CN1 are connected to either one of the first terminal connecting region 10 and the second terminal connecting region 20. Moreover, the two connector fixing lands 12 make up a first connector fixing region. The two connector fixing lands 22 make up a second connector fixing region.

Moreover, the connector fixing lands 12 and 22 are provided in a third region A3 lying between a belt-like first region A1 extending along the arrangement direction of the printed wiring boards 1 from the first terminal connecting region 10 on the plane of the printed wiring board 1 and a belt-like second region A2 extending along the arrangement direction from the second terminal connecting region 20 on the plane of the printed wiring board 1.

Figure 2:
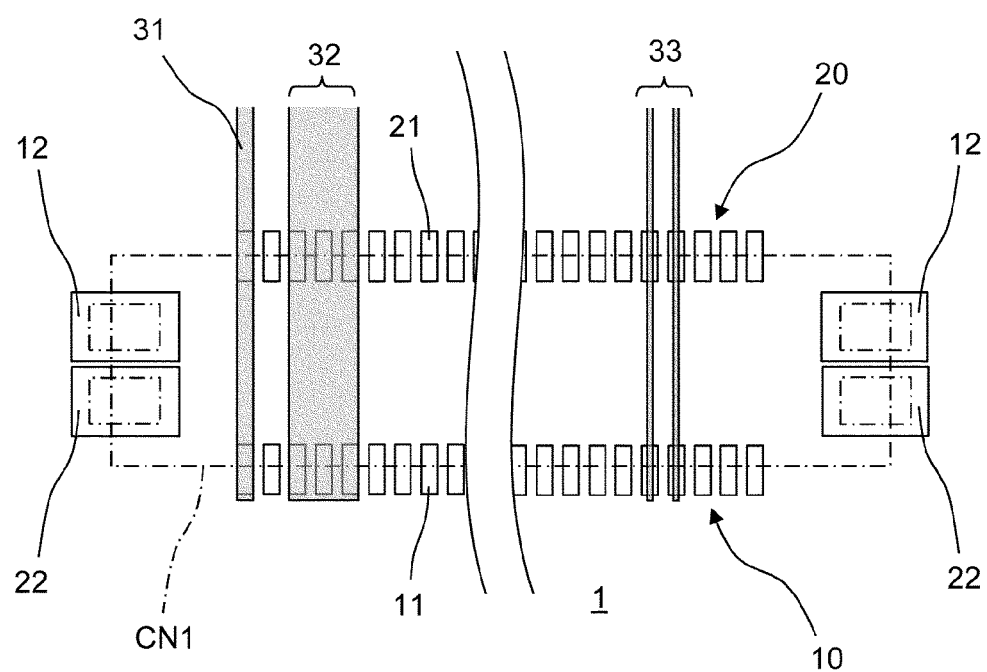
FIG. 2 shows a plan view of a wiring pattern of the main part of the printed wiring board according to the first embodiment of the present invention.

Moreover, FIG. 2 shows a plan view of a wiring pattern of the main part of the printed wiring board 1. As shown in FIG. 2, a wiring pattern 31 for a CMOS signal, a wiring pattern 32 for power supply, and a wiring pattern 33 for a differential signal electrically connect between the terminal connecting land 11 and the terminal connecting land 21 of the first terminal connecting region 10 and the second terminal connecting region 20, the terminal connecting lands 11 and 21 facing each other. The wiring patterns 31, 32, and 33 extend in a direction (up down direction in the drawing) being orthogonal to the longitudinal direction of the printed wiring board 1 between the first terminal connecting region 10 and the second terminal connecting region 20.

Figure 3:
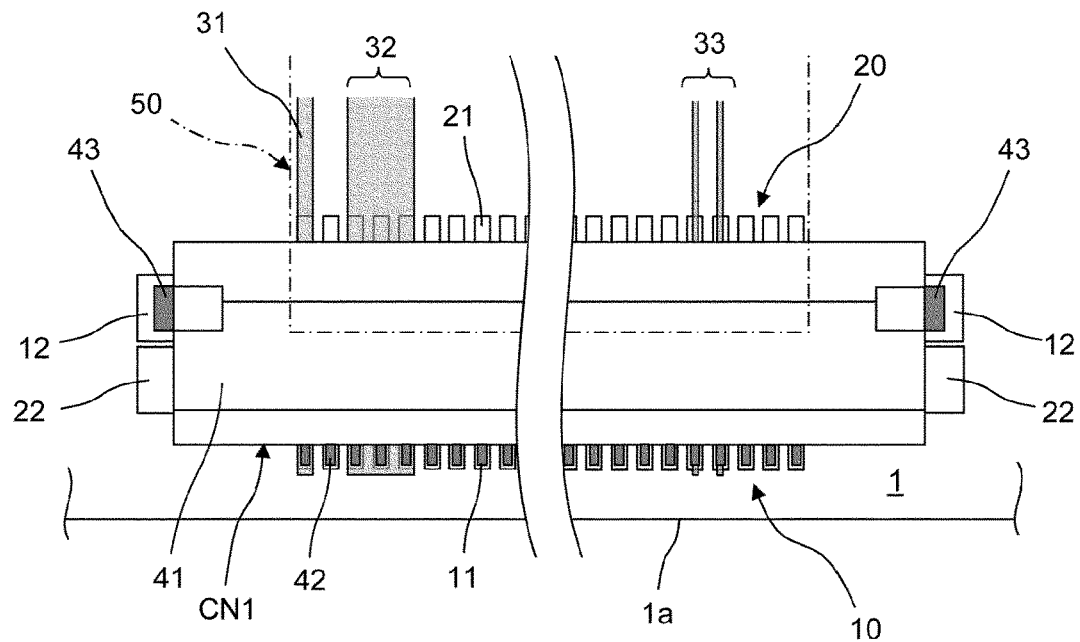
FIG. 3 shows a plan view of the connector being mounted to the main part of the printed wiring board according to the first embodiment.
Figure 4:
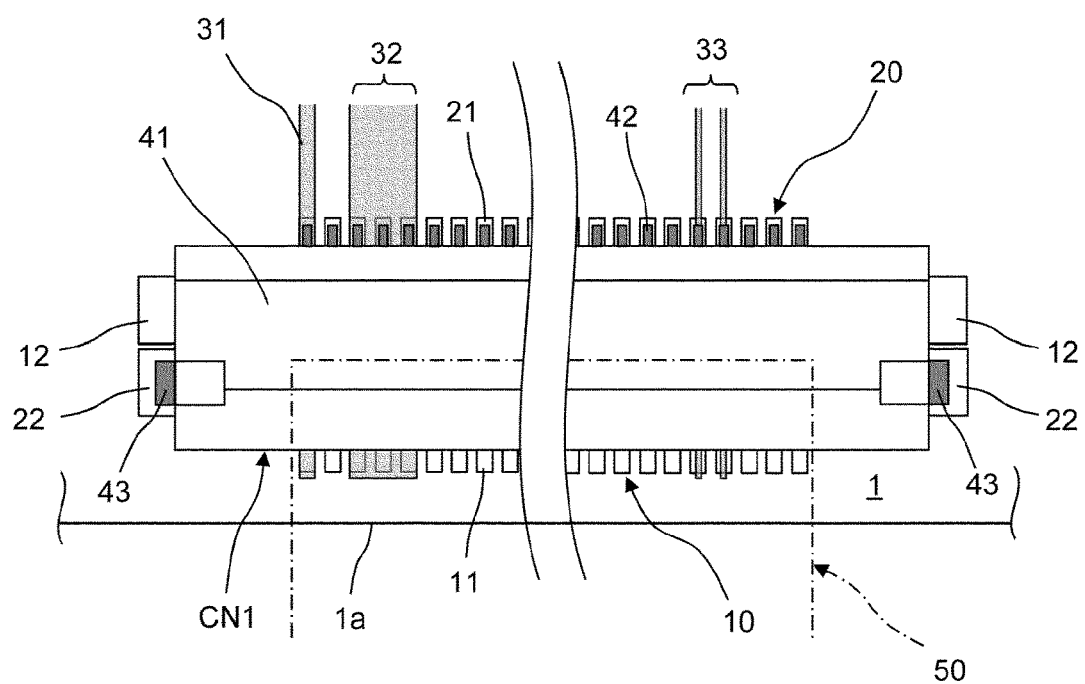
FIG. 4 shows a plan view of the connector being mounted to the main part of the printed wiring board according to the first embodiment.

Next, reversing the inserting direction to the connector CN1 by changing the mounting orientation of the connector CN1 on the printed wiring board 1 will be described using FIGS. 3 and 4. FIGS. 3 and 4 shows a plan view of the connector CN1 being mounted to the main part of the printed wiring board 1, where reference numeral 1a in FIGS. 3 and 4 indicates the end surface of the printed wiring board 1.

<Provisions for Flat Panel>

In the liquid crystal display panel 200 according to the flat panel specification, the panel surface of which liquid crystal display panel 200 is planar, as shown in FIG. 3, the connector CN1 is mounted in the orientation in which the inserting direction of the FPC 50 (one example of a belt-like wiring material) is to be from the liquid crystal display panel 200 end (upper portion in the drawing) (a first mounting). The FPC 50 connecting between the connectors CN1 of the neighboring printed wiring boards 1 is arranged so as to overlap the printed wiring boards 1. This makes it possible to realize narrow framing of the liquid crystal display panel 200 since the FPC 50 does not extend externally relative to the printed wiring board 1 (downward relative to the end surface 1a in the drawing).

The connector CN1 comprises a connector body 41 with an elongated shape having a longitudinal direction along the arrangement direction (left right direction in the drawing) of the plurality of printed wiring boards 1, the plurality of terminals 42 being arranged in the connector body 41 along the longitudinal direction, and the connector fixing terminals 43 being provided at the opposite ends of the connector body 41 in the longitudinal direction.

The plurality of terminals 42 of the connector CN1 is connected to the plurality of terminal connecting lands 11 of the first terminal connecting region 10, while the connector fixing terminals 43 at the opposite ends of the connector CN1 are connected to the connector fixing lands 12.

Figure 5:
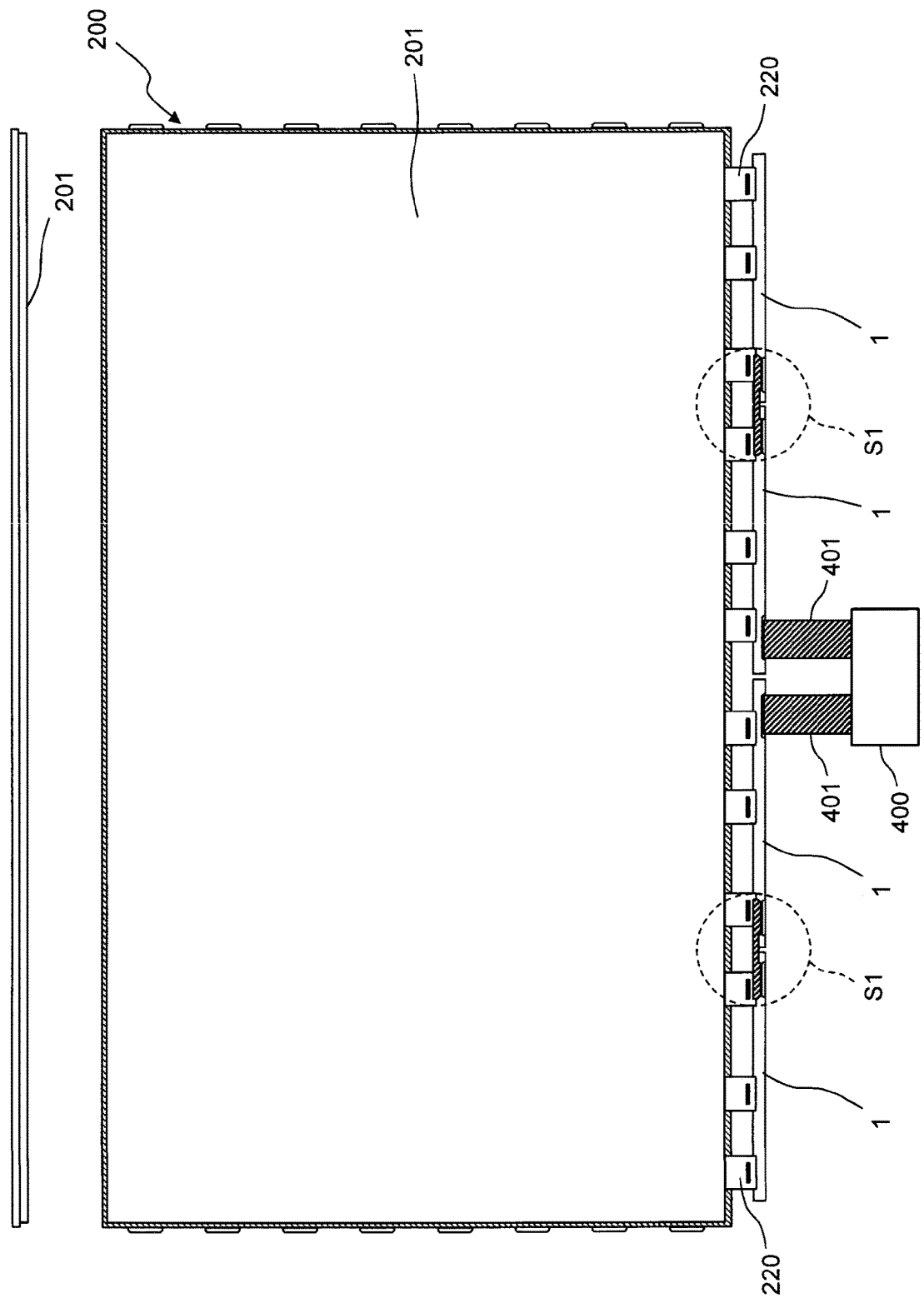
FIG. 5 shows a front view of a liquid crystal display panel according to the flat panel specification.
Figure 6:
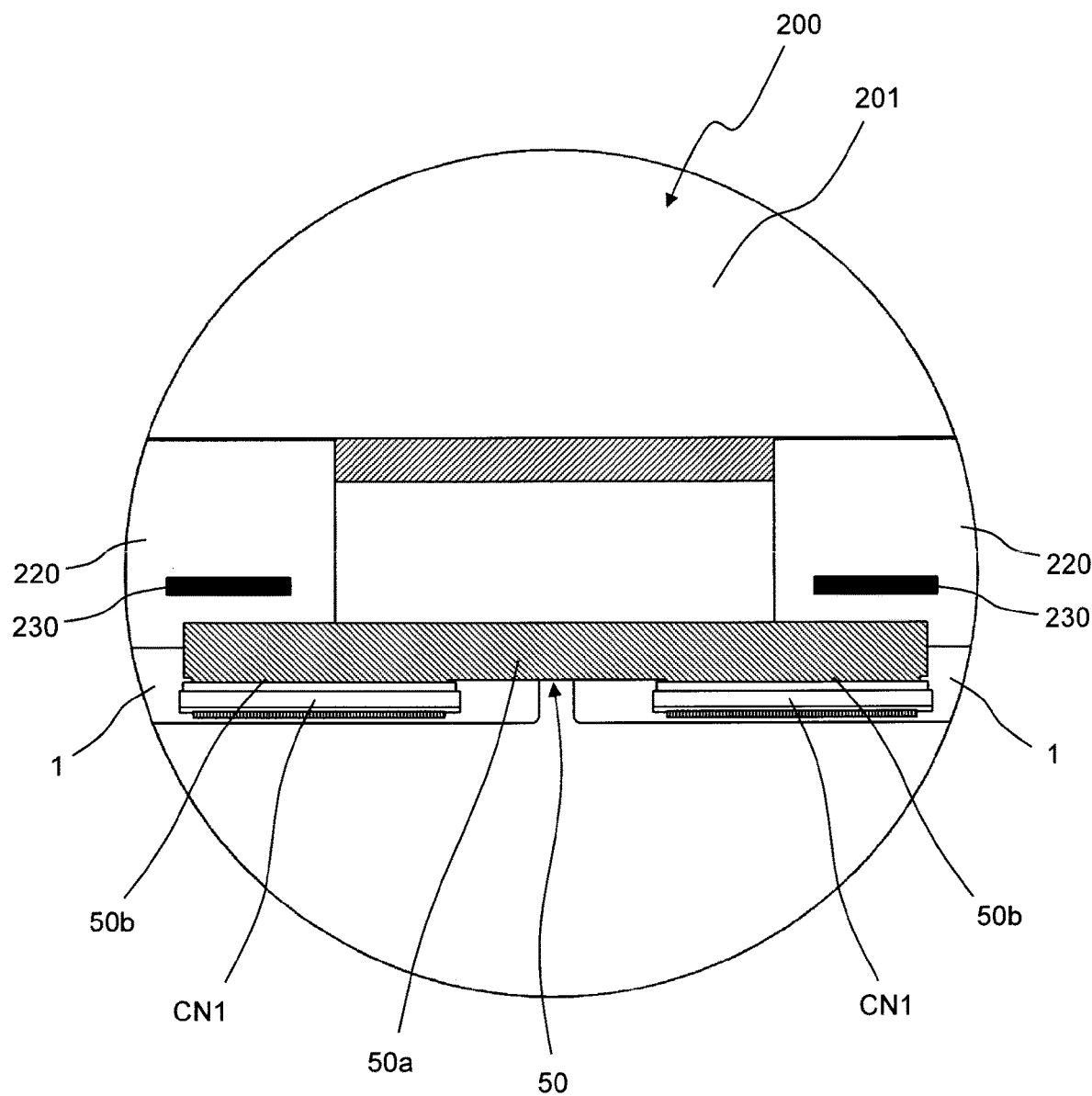
FIG. 6 shows an enlarged view of a region S1 shown in FIG. 5.

FIG. 5 shows a front view of the liquid crystal display panel 200 (one example of a display apparatus) according to the flat panel specification, while FIG. 6 shows an enlarged view of a region S1 shown in FIG. 5. In FIG. 5, reference numeral 400 indicates a board unit, while reference numeral 401 indicates an FPC to connect the board unit 400 and the printed wiring board 1. Moreover, a top view of the liquid crystal display panel 200 is shown at the upper end of FIG. 5, where a panel surface 201 is planar.

As in the liquid crystal display panel 200 being shown in FIGS. 5 and 6, according to the flat panel specification, the panel surface 201 of which liquid crystal display panel 200 is planar, the FPC 50 to connect between the connectors CN1 is arranged so as to overlap the printed wiring boards 1. In FIGS. 5 and 6, reference numeral 220 indicates a TCP to which a source driver 230 is mounted.

As shown in FIG. 6, the FPC 50 being the belt-like wiring material comprises a base portion 50a and two projecting portions 50b and has a U-shape, the base portion 50a extending in the arrangement direction of the printed wiring board 1 and the two projecting portions 50b extending in a direction being orthogonal to the longitudinal direction of the base portion 50a from the opposite ends of the base portion 50a. The two projecting portions 50b of the FPC 50 are inserted to the respective connectors CN1 from the liquid crystal display panel 200 end. The base portion 50a of the FPC 50 overlaps the printed wiring board 1.

<Provisions for Curved Panel>

In the liquid crystal display panel 300 according to the curved panel specification, the panel surface of which liquid crystal display panel 300 is curved, as shown in FIG. 4, the connector CN1 is mounted in the orientation in which the inserting direction of the FPC 50 is to be from the end being opposite to the liquid crystal display panel 300 (lower portion in the drawing) (a second mounting). In this case, the FPC 50 to connect between the connectors CN1 of the neighboring printed wiring boards 1 does not overlap the printed wiring boards 1. This makes it possible to curve the FPC 50 at the outside of the printed wiring board 1 while preventing the base portion 50a of the FPC 50 that is curved along the panel surface from interfering with the printed wiring board 1, making it possible to deal with upsizing of the liquid crystal display panel 300.

The plurality of terminals 42 of the connector CN1 is connected to the plurality of terminal connecting lands 21 of the second terminal connecting region 20, while the connector fixing terminals 43 at the opposite ends of the connector CN1 are connected to the connector fixing lands 22.

Figure 7:
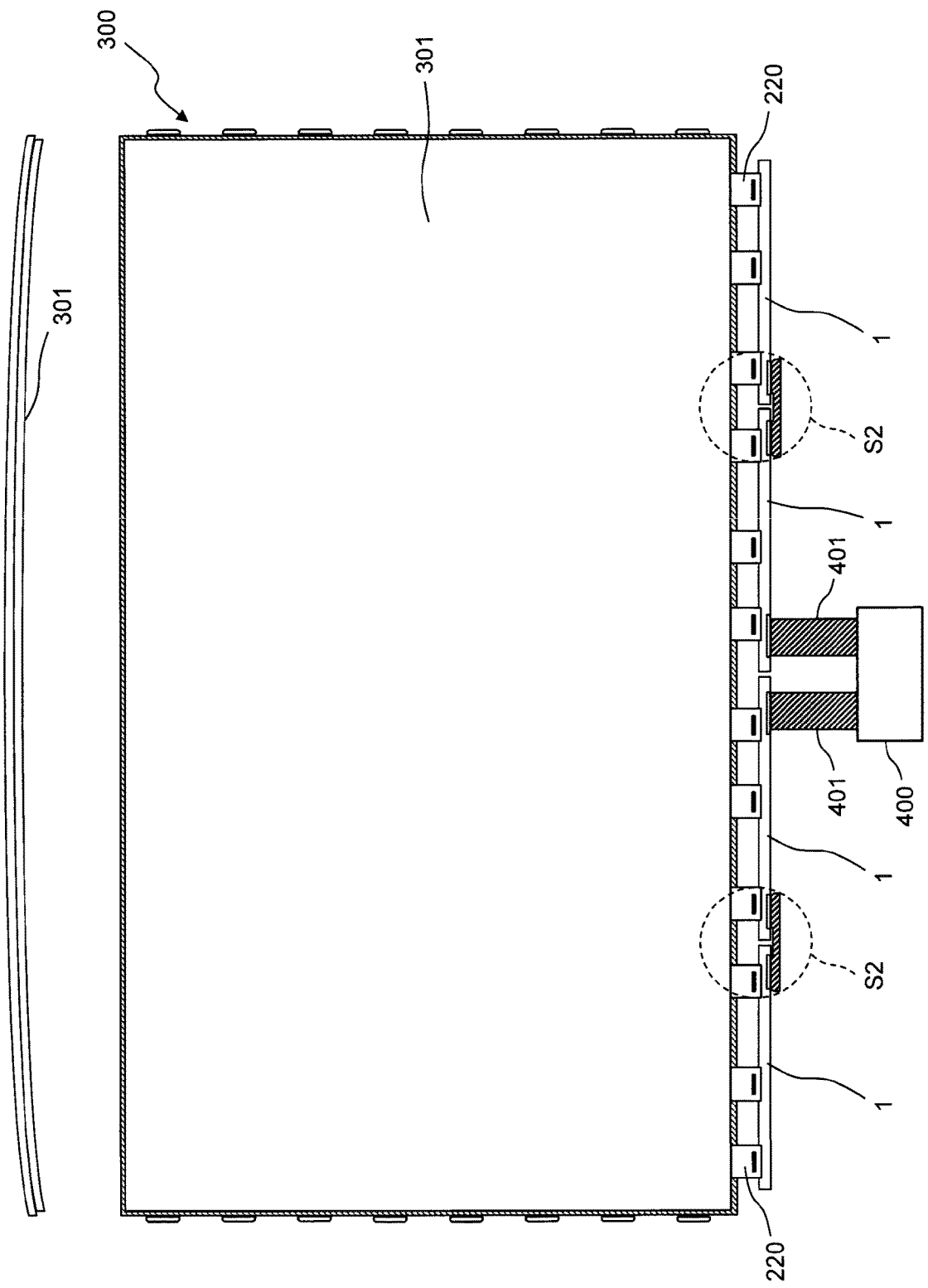
FIG. 7 shows a front view of the liquid crystal display panel according to the curved panel specification.
Figure 8:
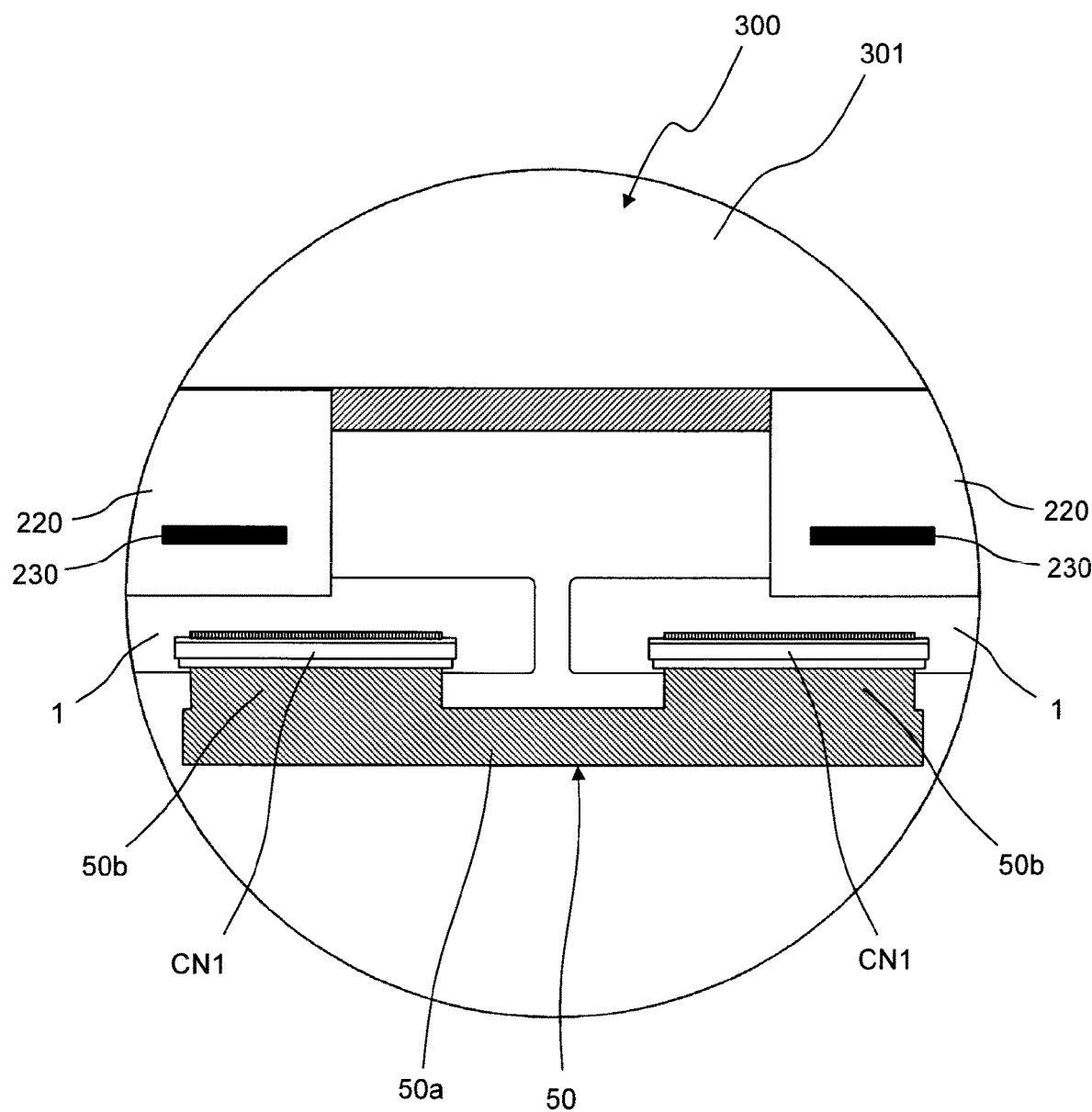
FIG. 8 shows an enlarged view of a region S2 shown in FIG. 7.

FIG. 7 shows a front view of the liquid crystal display panel 300 (one example of a display apparatus) according to the curved panel specification and FIG. 8 shows an enlarged view of the region S2 shown in FIG. 7. A top view of the liquid crystal display panel 300 is shown at the upper end in FIG. 7, where a panel surface 301 is curved.

As in the liquid crystal display panel 300 being shown in FIGS. 7 and 8, according to the curved panel specification, the panel surface 301 of which liquid crystal display panel 300 is curved, the FPC 50 to connect between the connectors CN1 is arranged at the end being opposite to the liquid crystal display panel 300 with respect to the printed wiring board 1. The two projecting portions 50b of the FPC 50 are inserted to the respective connectors CN1 from the end being opposite to the liquid crystal display panel 200 end. The base portion 50a of the FPC 50 does not overlap the printed wiring board 1.

This ensures that the FPC 50 being curved along the panel surface 301 of the liquid crystal display panel 300 do not interfere with the printed wiring board 1 and that a large stress be not applied to the FPC 50.

In this way, in the electrical connection structure for the wiring board according to the first embodiment, the first and second terminal connecting regions 10 and 20 and the connector fixing lands 12 and 22 (the first connector fixing region and the second connector fixing region) are configured such that both of the first mounting of the connector CN1 with the orientation in which the inserting direction of the FPC 50 (the belt-like wiring material) is to be from the liquid crystal display panel 200 end and the second mounting of the connector CN1 with the orientation in which the inserting direction of the FPC 50 is to be from the end being opposite to the liquid display panel 300 are possible.

In this way, one type of printed wiring board 1 can be used for both cases of mounting the connector CN1 in the orientation in which the inserting direction of the FPC 50 (the belt-like wiring material) is to be from the liquid crystal display panel 200 end and mounting the connector CN1 in the orientation in which the inserting direction of the FPC 50 is to be from the end being opposite to the liquid crystal display panel 300. Therefore, by providing the printed wiring board 1 in which the mounting orientation of the connector CN1 can be changed, it is possible to realize the electrical connection structure for a wiring board in which the inserting direction to the connector CN1 can be reversed.

Moreover, in the electrical connection structure for the wiring board according to the first embodiment, the first terminal connecting region 10 and the second terminal connecting region 20 are arranged such that they are provided mutually parallel at a predetermined interval in a direction being orthogonal to the arrangement direction of the printed wiring board 1 and the positions at the opposite ends of the first terminal connecting region 10 and the positions at the opposite ends of the second terminal connecting region 20 face each other. In this way, the connector CN1 is arranged at the same mounting position regardless of the mounting orientation of the connector CN1, making it possible to reduce the mounting space of the connector CN1. Moreover, the connector fixing lands 12 and 22 are provided in the third region A3 between the first region A1 and the second region A2, making it possible to further reduce the mounting space of the connector CN1.

Moreover, in the electrical connection structure for the wiring board according to the first embodiment, the connectors CN1 being mounted to mutually neighboring printed wiring boards 1, respectively, in the plurality of printed wiring boards 1 are electrically connected via the FPC (flexible wiring board) 50. This makes it possible to maintain the corresponding relationships of the plurality of terminals 42 of both connectors CN1 even when the orientations of the connectors CN1 being mounted to mutually neighboring printed wiring boards 1 are reversed.

While the FPC 50 is used as the belt-like wiring material in the first embodiment, an FFC (flexible flat cable) can be used. In a case that the FFC is used, a connector designed for the FFC is used.

Moreover, in the liquid crystal display apparatus comprising the electrical connection structure for the wiring board according to the first embodiment, the mounting orientation of the CN1 can be changed to reverse the inserting direction to the connector CN1, making it possible to deal with the reverse with one type of printed wiring board 1, and the need to design and develop two types of printed wiring boards is eliminated, making it possible to reduce cost.

Furthermore, while the printed wiring board 1 to distribute the electrical signal and the power to drive the liquid crystal display panel 200, 300 is used in the electrical connection structure for the wiring board according to the first embodiment, a printed wiring board to distribute one of the electrical signal and the power to drive the liquid crystal display panel 200, 300 can be used.

Moreover, in the electrical connection structure for the wiring board according to the first embodiment, a minimum rectangular region containing the first terminal connecting region 10 and the first connector fixing land 12 and a minimum rectangular region containing the second terminal connecting region 20 and the second connector fixing land 22 overlap at least in a part, making it possible to reduce a range being occupied by the first and second terminal connecting regions 10 and 20 and the first and second connector fixing lands 12 an 22 as much as possible.

Furthermore, while the connector fixing lands 12 and 22 are provided in the third region A3 between the first and second regions A1 and A2 in the electrical connection structure for the wiring board according to the first embodiment, the connector fixing lands 12 and 22 can be provided in the first region A1, the second region A2 and the third region A3.

Second Embodiment

Figure 9:
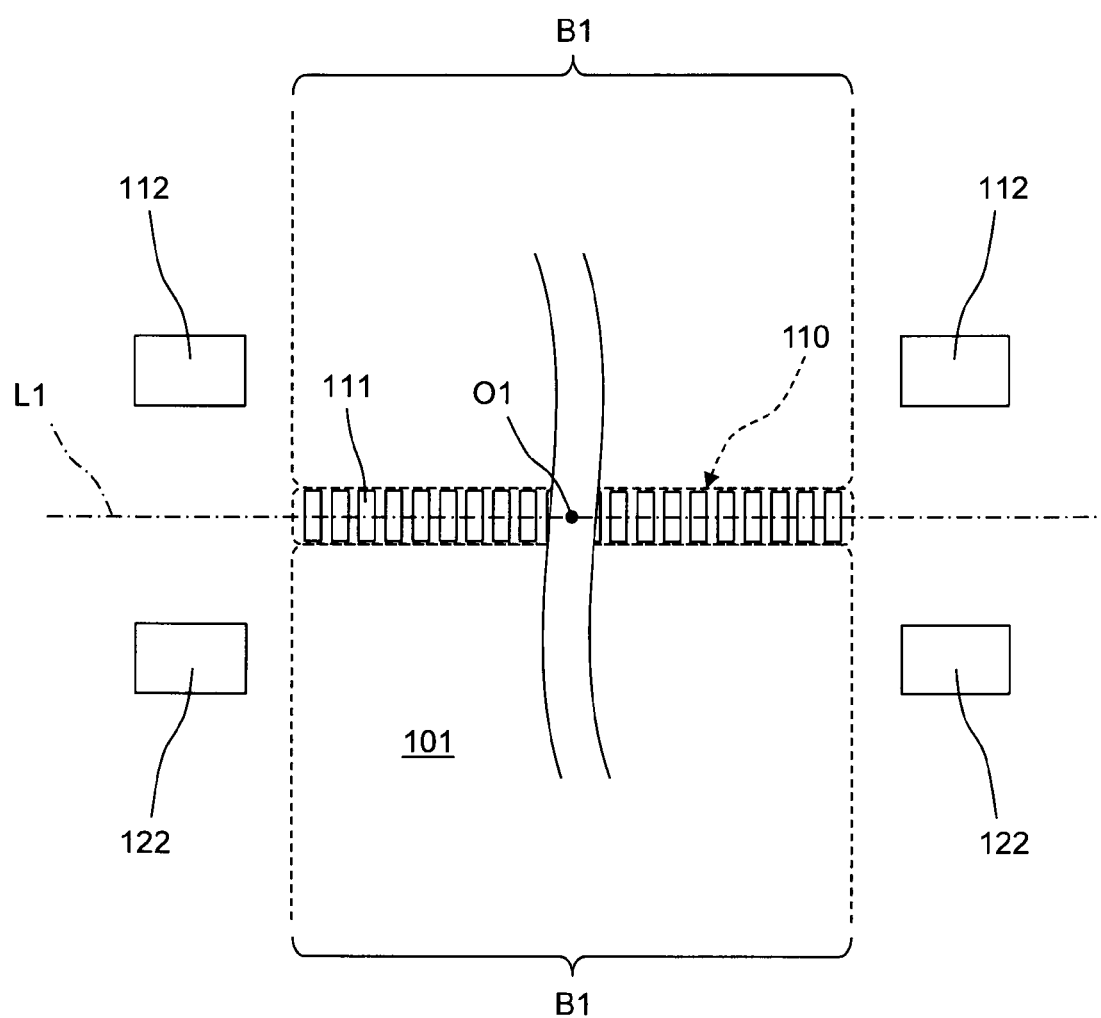
FIG. 9 shows a plan view of the main part of a printed wiring board to be used for an electrical connection structure for a wiring board according to a second embodiment of the present invention, to which main part the connector is to be mounted.

FIG. 9 shows a plan view of the main part of the printed wiring board 101 to be used for the electrical connection structure for the wiring board according to a second embodiment of the present invention, to which main part the connector CN1 (shown in FIGS. 11 and 12) is to be mounted. In FIGS. 9 to 12, the upper portion in each drawing is to be the liquid crystal display end. Here, the liquid crystal display panel is one example of a display apparatus.

The printed wiring board 101 to be used for the electrical connection structure for the wiring board according to the second embodiment is arranged in a plurality along one side of a liquid crystal display panel 200, 300 (shown in FIGS. 13 and 15) and distributes an electrical signal and power to drive the liquid crystal display panel 200, 300. Moreover, a connector CN1 (shown in FIGS. 11 and 12) is mounted to each of mutually neighboring printed wiring boards 101 in the plurality of printed wiring boards 101 and the neighboring printed wiring boards 101 are electrically connected with each other via an FPC 50 (shown in FIG. 11) to be connected to the connector CN1.

As shown in FIG. 9, the printed wiring board 101 comprises a plurality of terminal connecting lands 111 being arranged along the longitudinal direction (left-right direction in the drawing) of the printed wiring board 101, and connecter fixing lands 112, 122 to which a fixing terminal 43 (shown in FIGS. 11 and 12) at the opposite ends of the connector CN1 is connected.

The plurality of terminal connecting lands 111 makes up a terminal connecting region 110. A plurality of terminals 42 (shown in FIGS. 11 and 12) of the connector CN1 are connected to the plurality of terminal connecting lands 111. Moreover, the two connector fixing lands 112 make up a first connector fixing region. The two connector fixing lands 122 make up a second connector fixing region.

In the electrical connection structure for the wiring board according to the second embodiment, each of the connector fixing lands 112 and the connector fixing lands 122 are respectively arranged at regions except a belt-like region B1 being extended along a direction (up down direction in the drawing) being orthogonal to the arrangement direction of the printed wiring board 101 from the single terminal connecting region 110 on a plane of the printed wiring board 101. The connector fixing lands 112 and the connector fixing lands 122 are arranged so as to face each other via a center line L1 of the single terminal connecting region 110 along the longitudinal direction of the single terminal connecting region 110. In more detail, the connector fixing lands 112 and 122 are provided at a predetermined interval, and in a linear symmetrical manner and in a 180 degrees rotationally symmetrical manner relative to a center O1 of the terminal connecting region 110. The positions of the connector fixing lands do not have to be linearly symmetrical as long as the positions of the connector fixing lands are rotationally symmetrical.

Figure 10:
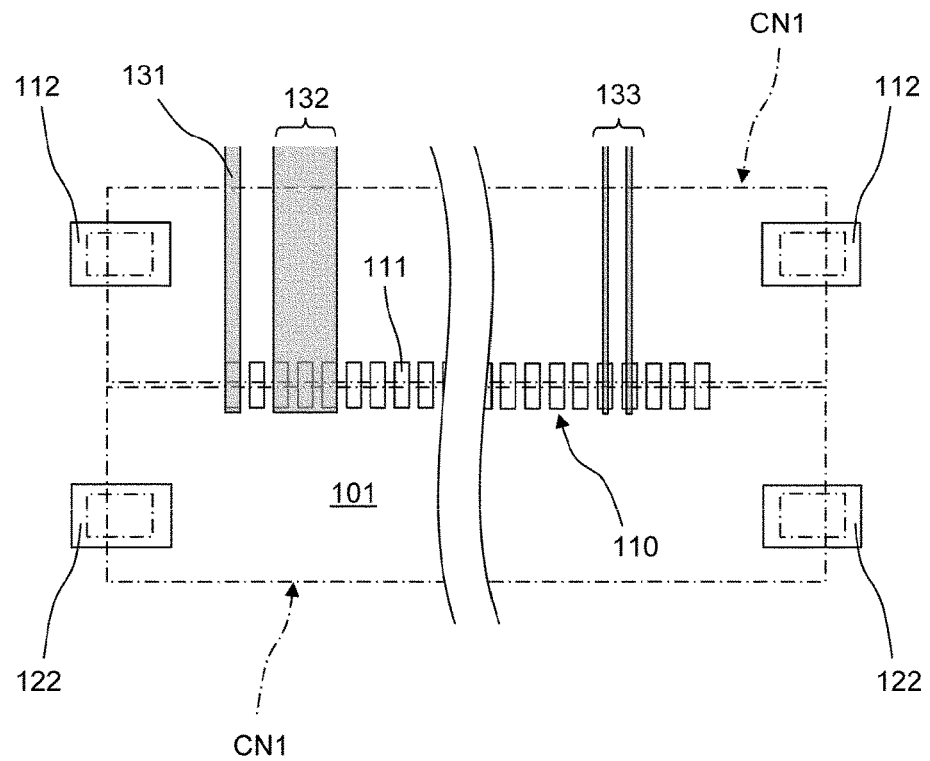
FIG. 10 shows a plan view of the wiring pattern of the main part of the printed wiring board according to the second embodiment of the present invention.

Moreover, FIG. 10 shows a plan view of the wiring pattern of the main part of the printed wiring board 101. As shown in FIG. 10, a wiring pattern 131 for a CMOS signal, a wiring pattern 132 for power supply, and a wiring pattern 133 for a differential signal are electrically connected to the terminal connecting land 111 of the terminal connecting region 110.

Figure 11:
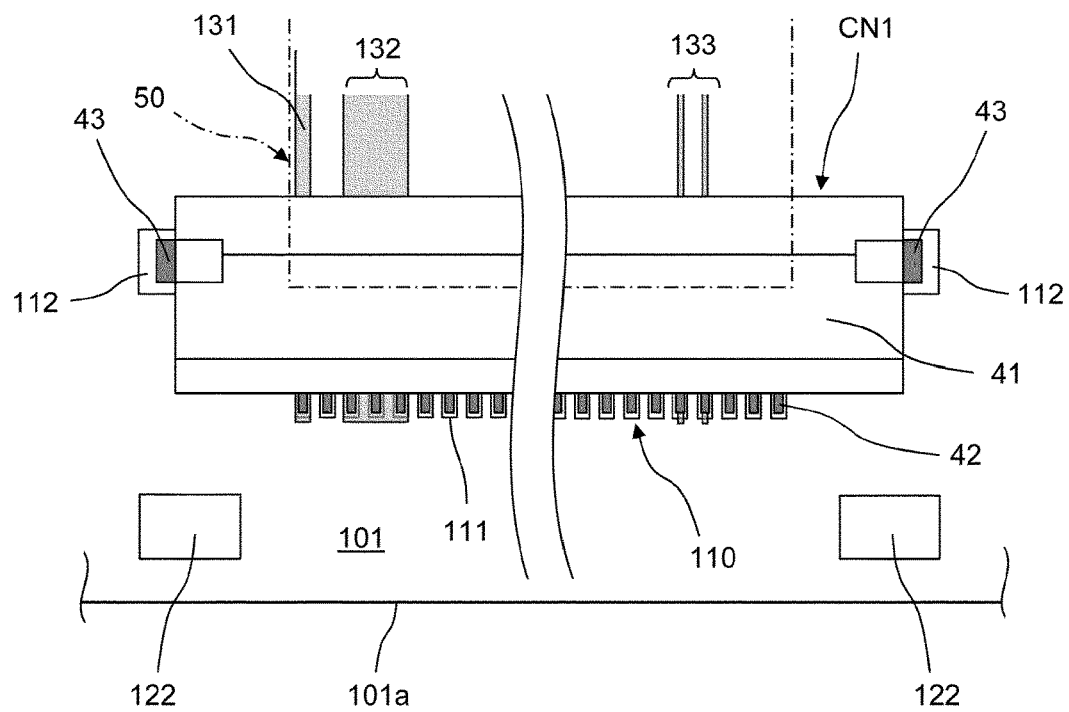
FIG. 11 shows a plan view of the connector being mounted to the main part of the printed wiring board according to the second embodiment.
Figure 12:
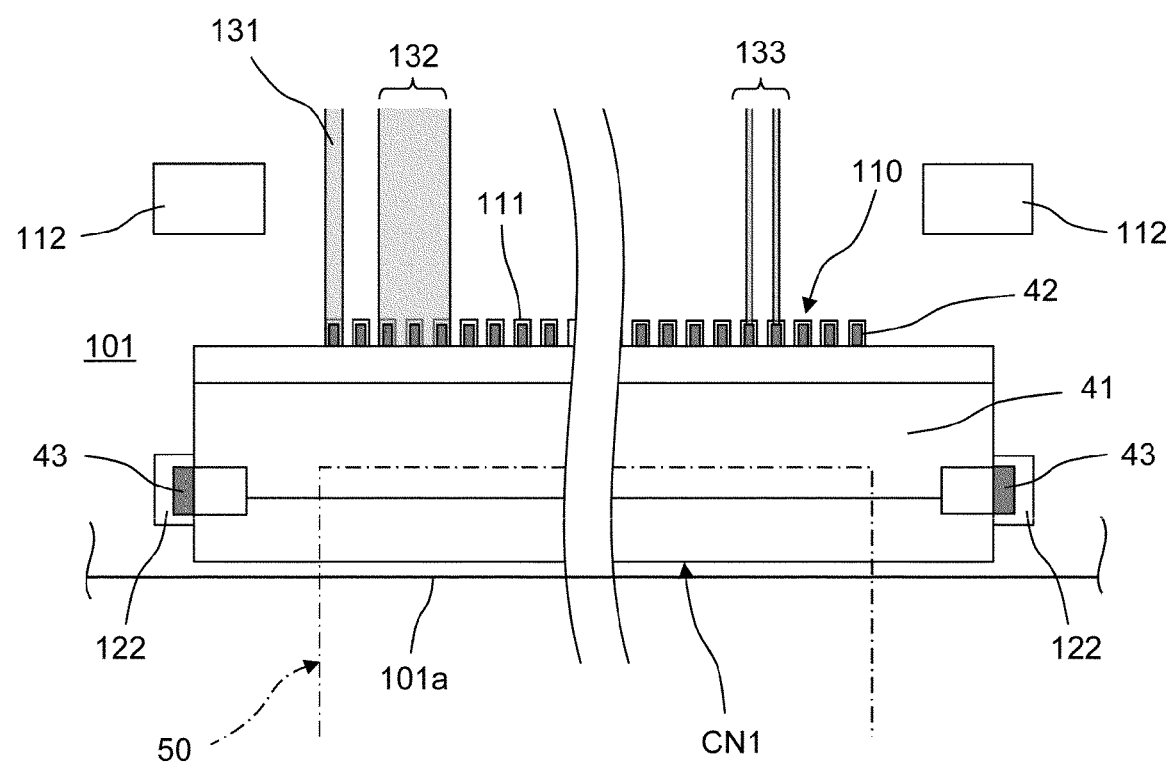
FIG. 12 shows a plan view of the connector being mounted to the main part of the printed wiring board according to the second embodiment.

Next, reversing the inserting direction to the connector CN1 by changing the mounting orientation of the connector CN1 on the printed wiring board 101 will be described using FIGS. 11 and 12. FIGS. 11 and 12 show a plan view of the connector CN1 being mounted to the main part of the printed wiring board 101, where reference numeral 101a in FIGS. 11 and 12 indicates the end surface of the printed wiring board 101.

<Provisions for Flat Panel>

In the liquid crystal display panel 200 according to the flat panel specification, the panel surface of which liquid crystal display panel 200 is planar, as shown in FIG. 11, the connector CN1 is mounted in the orientation in which the inserting direction of the FPC 50 (one example of a belt-like wiring material) is to be from the liquid crystal display panel 200 end (upper portion in the drawing) (a first mounting). The FPC 50 connecting between the connectors CN1 of the neighboring printed wiring boards 101 is arranged so as to overlap the printed wiring boards 101. This makes it possible to realize narrow framing of the liquid crystal display panel 200 since the FPC 50 does not extend externally relative to the printed wiring board 101 (downward relative to the end surface 101a in the drawing).

Figure 13:
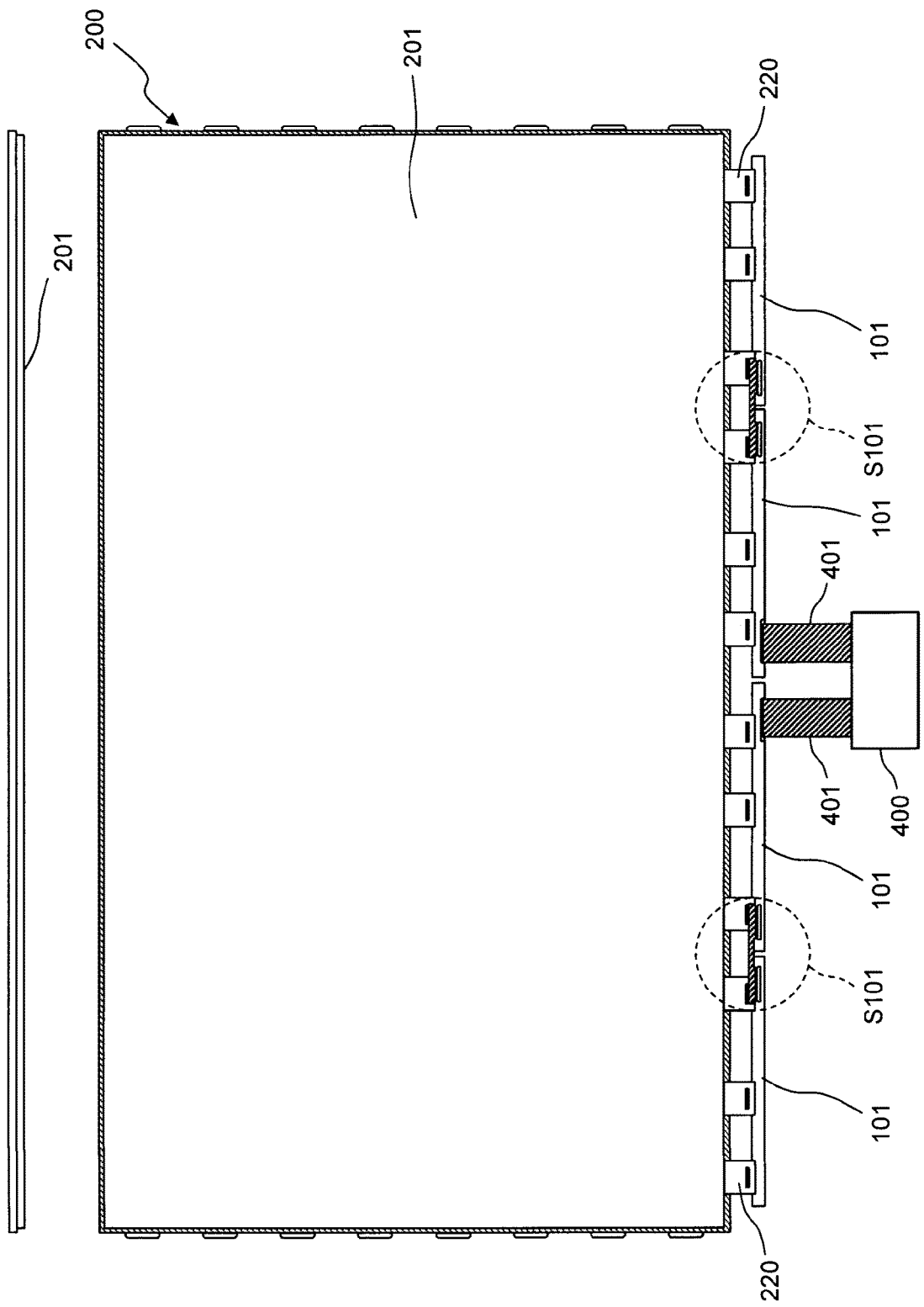
FIG. 13 shows a front view of the liquid crystal display panel according to the flat panel specification.
Figure 14:
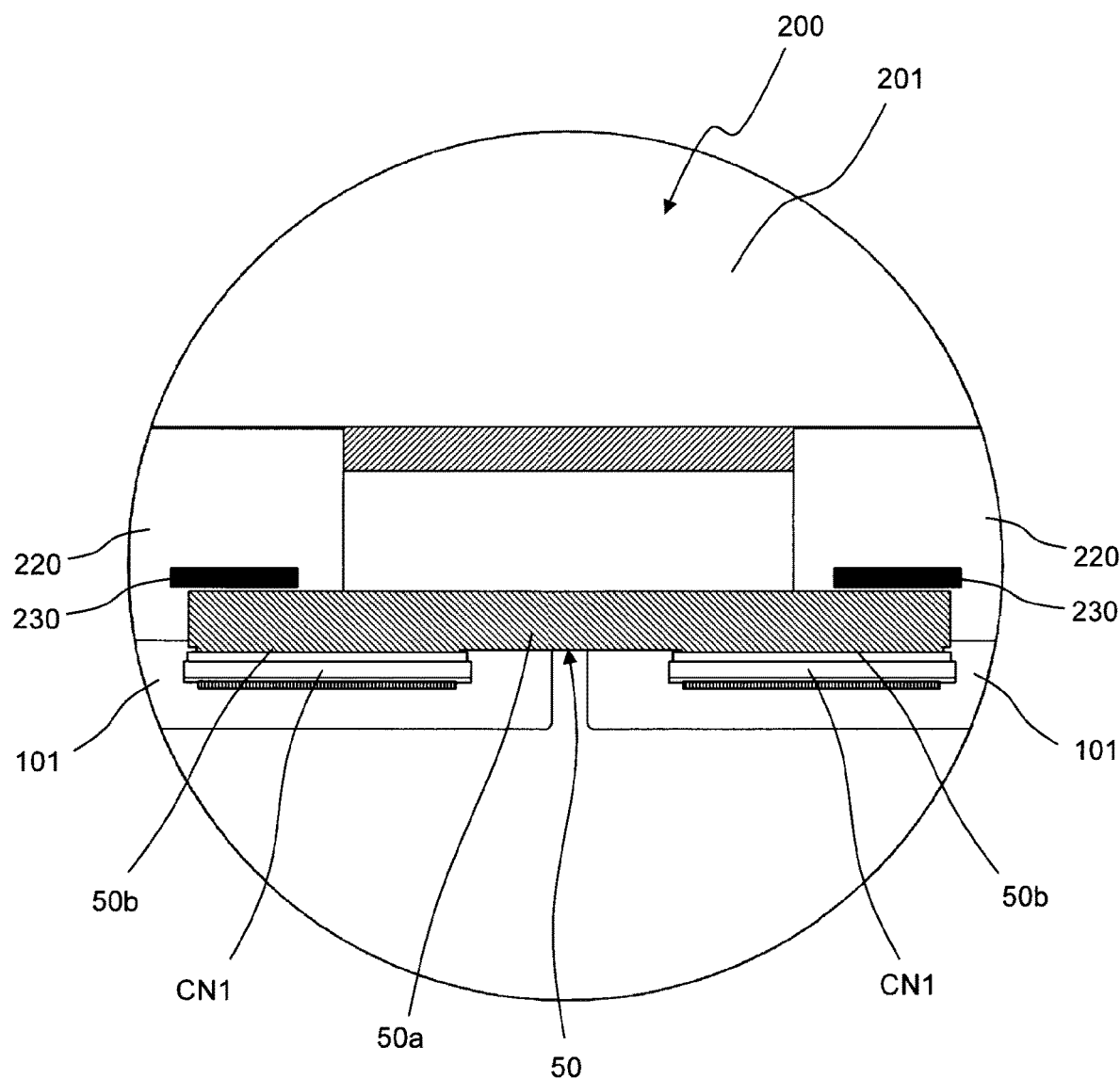
FIG. 14 shows an enlarged view of a region S101 shown in FIG. 13.

The plurality of terminals 42 of the connector CN1 are connected to the plurality of terminal connecting lands 111 of the second terminal connecting region 110, while the connector fixing terminals 43 at the opposite ends of the connector CN1 are connected to the connector fixing lands 112. FIG. 13 shows a front view of the liquid crystal display panel 200 (one example of the display apparatus) according to the flat panel specification, while FIG. 14 shows an enlarged view of a region S101 shown in FIG. 13. A top view of the liquid crystal display panel 200 is shown at the upper end in FIG. 13, where a panel surface 201 is planar.

As in the liquid crystal display panel 200 shown in FIGS. 13 and 14, according to the flat panel specification, the panel surface 201 of which liquid crystal display panel 200 is planar, the FPC 50 to connect between the connectors CN1 is arranged so as to overlap the printed wiring boards 101. In FIGS. 13 and 14, reference numeral 220 indicates a TCP to which a source driver 230 is mounted.

As shown in FIG. 14, the FPC 50 being the belt-like wiring material comprises a base portion 50a and two projecting portions 50b and has a U-shape, the base portion 50a extending in the arrangement direction of the printed wiring board 101 and the two projecting portions 50b extending in a direction being orthogonal to the longitudinal direction of the base portion 50a from the opposite ends of the base portion 50a. The two projecting portions 50b of the FPC 50 are inserted to the respective connectors CN1 from the liquid crystal display panel 200 end. The base portion 50a of the FPC 50 overlaps the printed wiring boards 101.

<Provisions for Curved Panel>

In the liquid crystal display panel 300 according to the curved panel specification, the panel surface of which liquid crystal display panel 300 is curved, as shown in FIG. 12, the connector CN1 is mounted in the orientation in which the inserting direction of the FPC 50 (one example of the belt-like wiring material) is to be from the end being opposite to the liquid crystal display panel 300 (lower portion in the drawing) (a second mounting). In this case, the FPC 50 to connect between the connectors CN1 of the neighboring printed wiring boards 101 does not overlap the printed wiring boards 101. This makes it possible to curve the FPC 50 at the outside of the printed wiring board 101 while preventing the base portion 50a of the FPC 50 that is curved along the panel surface from interfering with the printed wiring board 101, making it possible to deal with upsizing of the liquid crystal display panel 300.

The plurality of terminals 42 of the connector CN1 is connected to the plurality of terminal connecting lands 111 of the first terminal connecting region 110, while the connector fixing terminals 43 at the opposite ends of the connector CN1 are connected to the connector fixing lands 122.

Figure 15:
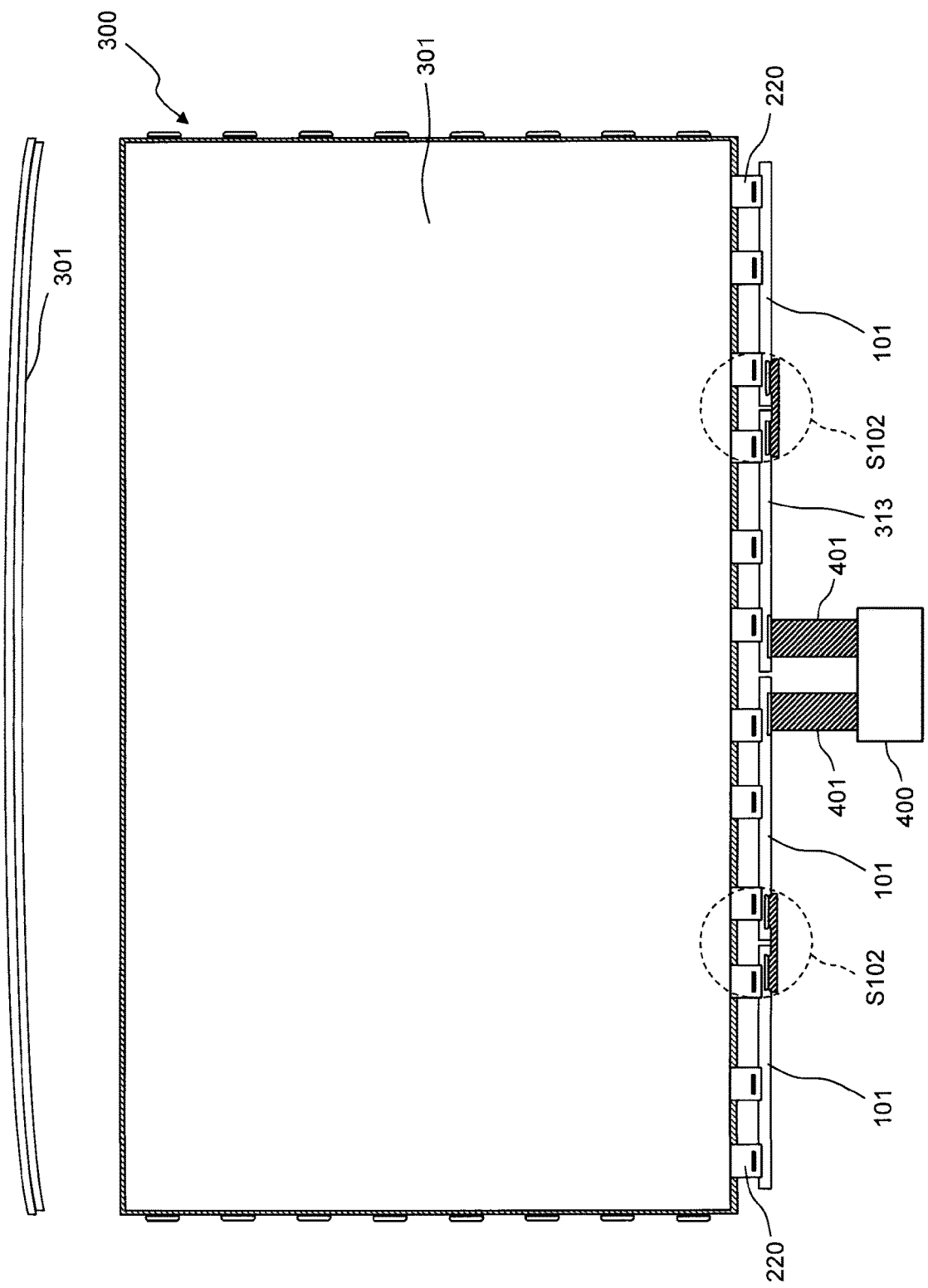
FIG. 15 shows a front view of the liquid crystal display panel according to the curved panel specification.
Figure 16:
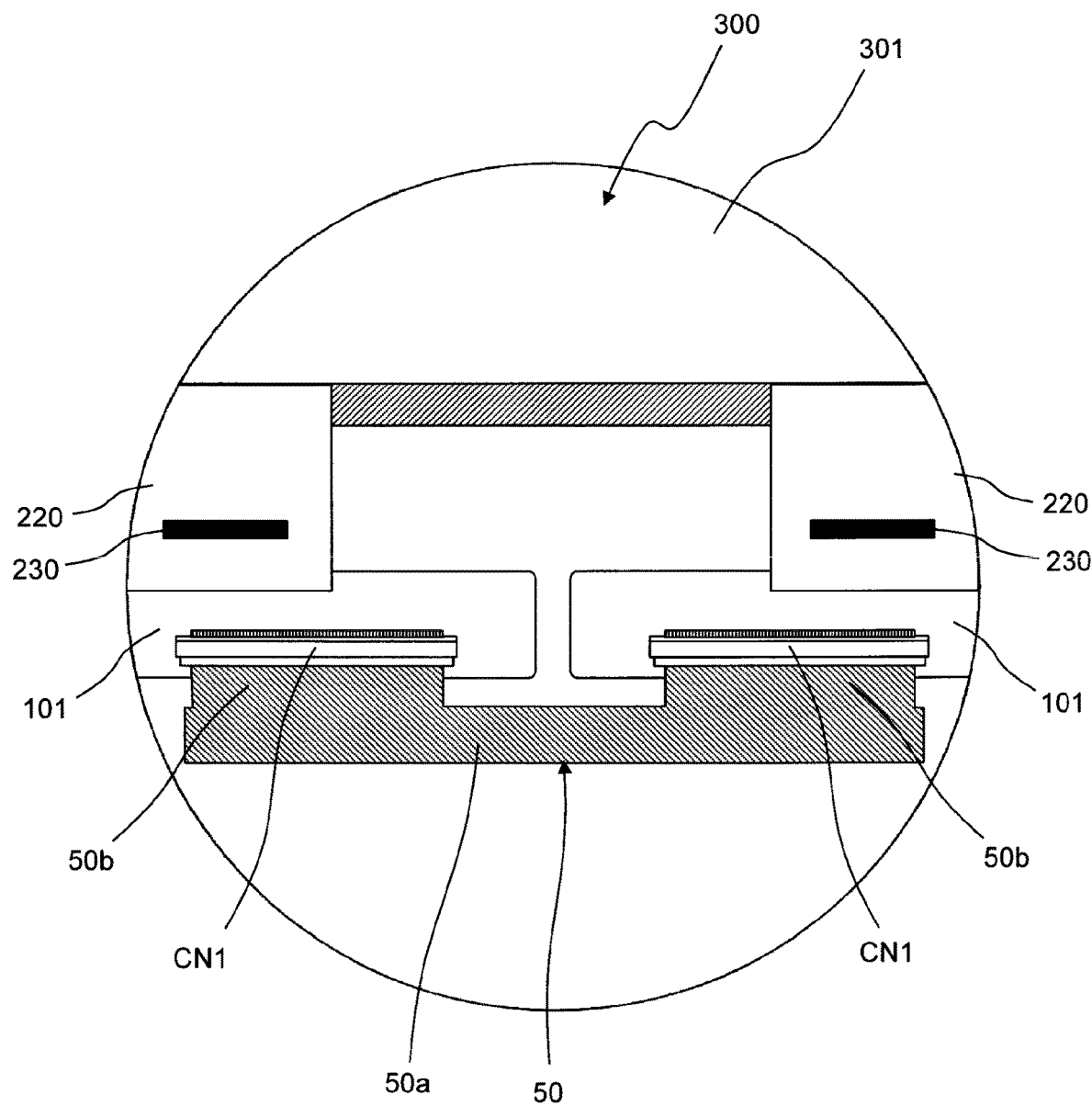
FIG. 16 shows an enlarged view of a region S102 shown in FIG. 15.

FIG. 15 shows a front view of the liquid crystal display panel 300 (one example of a display apparatus) according to the curved panel specification, and FIG. 16 shows an enlarged view of a region S102 shown in FIG. 15. A top view of the liquid crystal display panel 300 is shown at the upper end in FIG. 15, where a panel surface 301 is curved.

As in the liquid crystal display panel 300 being shown in FIGS. 15 and 16, according to the curved panel specification, the panel surface 301 of which liquid crystal display panel 300 is curved, the FPC 50 to connect between the connectors CN1 is arranged at the end being opposite to the liquid crystal display panel 300 with respect to the printed wiring board 101. The two projecting portions 50b of the FPC 50 are inserted to the respective connectors CN1 from the end being opposite to the liquid crystal display panel 200 end. The base portion 50a of the FPC 50 does not overlap the printed wiring boards 101.

This ensures that the FPC 50 being curved along the panel surface 301 of the liquid crystal display panel 300 do not interfere with the printed wiring board 101 and that a large stress be not applied to the FPC 50.

In this way, in the electrical connection structure for the wiring board according to the second embodiment, in a case that the connector CN1 is mounted to the wiring board 101 in the orientation in which the inserting direction of the FPC 50 (the belt-like wiring material) is to be from the liquid crystal display panel 200, the plurality of terminals 42 at the end being opposite to the liquid crystal display panel 200 is connected to the single terminal connecting region 110 and the connector fixing terminal 43 is connected to one connector fixing land, which is located at the display panel end with respect to the single terminal connecting region 110, of the connector fixing land 112 (the first connector fixing region) and the connector fixing land 122 (the second connector fixing region), or, in other words, the connector fixing land 112.

On the other hand, in a case that the connector CN1 is mounted to the wiring board 101 in the orientation in which the inserting direction of the FPC 50 is to be from the end being opposite to the liquid crystal display panel 300, the plurality of terminals 42 at the liquid crystal display panel 300 end is connected to the single terminal connecting region 110, and the connector fixing terminal 43 is connected to the other connector fixing land, which is located at the end being opposite to the liquid crystal display panel 300 with respect to the single terminal connecting region 110, of the connector fixing land 112 (the first connector fixing region) and the connector fixing land 122 (the second connector fixing region), or, in other words, the connector fixing land 122.

The electrical connection structure for the wiring board according to the second embodiment has the same effects as that of the electrical connection structure for the wiring board according to the first embodiment.

While the electrical connection structure for the wiring board is used for the liquid crystal display panel 200, 300 as the display apparatus in the first and second embodiments, the present invention can be applied not only to the liquid crystal display panel, but also to display apparatuses having other configurations.

While specific embodiments of the present invention have been described herein, the present invention is not to be limited to the first and second embodiments, so that it can be changed variously and embodied within the scope of the present invention.

The present invention and embodiments can be summarized as follows:

An electrical connection structure for a wiring board according to one aspect of the present invention comprises:

a plurality of wiring boards 1, 101 to distribute an electrical signal and/or power to drive a display panel, the plurality of wiring boards 1, 101 being arranged along one side of the display panel; and connectors CN1 being mounted to mutually neighboring wiring boards 1, 101, respectively, of the plurality of wiring boards 1, 101 to electrically connect between the wiring boards 1, 101 via a belt-like wiring material 50, wherein the connector CN1 comprises:

a connector body 41 with an elongated shape having a longitudinal direction along an arrangement direction of the plurality of wiring boards 1, 101;

a plurality of terminals 42 being arranged in the connector body 41 along the longitudinal direction; and connector fixing terminals 43 being provided at opposite ends of the connector body 41 in the longitudinal direction, the wiring board 1, 101 comprises a terminal connecting region 10, 20, 110 to which the plurality of terminals 42 of the connector CN1 is connected; and a connector fixing region 12, 22, 112, 122 to which the connector fixing terminals 43 at opposite ends of the connector CN1 are connected, and the terminal connecting region 10, 20, 110 and the connector fixing region 12, 22, 112, 122 are configured to enable both of a first mounting of the connector CN1 and a second mounting of the connector CN1, wherein the first mounting of the connector CN1 has an orientation in which an inserting direction of the belt-like wiring material 50 is to be from a display panel end, and the second mounting of the connector CN1 has an orientation in which the inserting direction of the belt-like wiring material 50 is to be from an end being opposite to the display panel.

The above-described configuration makes it possible to mount a connector CN1 to a wiring board 1, 101 in the orientation in which the inserting direction of a belt-like wiring material 50 is to be from a display panel end, and to mount a connector CN1 to a wiring board 1, 101 in the orientation in which the inserting direction of the belt-like wiring material 50 is to be from the end being opposite to the display panel. Therefore, by providing the wiring board 1, 101 in which the mounting orientation of the connector CN1 can be changed, it is possible to realize an electrical connection structure for a wiring board in which the inserting direction to the CN1 can be reversed.

Moreover, in an electrical connection structure for a wiring board according to one embodiment, the terminal connecting region 10, 20, 110 comprises a first terminal connecting region 10, 110 to which the plurality of terminals 42 of the connector CN1 is connected in a case of the first mounting and a second terminal connecting region 20, 110 to which the plurality of terminals 42 of the connector CN1 is connected in a case of the second mounting;

the connector fixing region 12, 22, 112, 122 comprises a first connector fixing region 12, 112 to which the connector fixing terminals 43 at the opposite ends of the connector CN1 are connected in the case of the first mounting and a second connector fixing region 22, 122 to which the connector fixing terminals 43 at the opposite ends of the connector CN1 are connected in the case of the second mounting; and the terminal connecting region and the connector fixing region are configured such that a minimum rectangular region comprising the first terminal connecting region 10, 110 and the first connector fixing region 12, 112 and a minimum rectangular region comprising the second terminal connecting region 20, 110 and the second connector fixing region 22, 122 overlap at least in a part.

According to the above embodiment, the minimum rectangular region containing the first terminal connecting region 10, 110 and the first connector fixing region 12, 112 and the minimum rectangular region containing the second terminal connecting region 20, 110 and the second connector fixing region 22, 122 overlap at least in a part, so that a range occupied by the first and second terminal connecting regions 10, 20, 110 and the first and second connector fixing regions 12, 112, 22, 122 can be reduced.

Moreover, in the electrical connection structure for the wiring board according to one embodiment, the first terminal connecting region 10 and the second terminal connecting region 20 are provided mutually parallel at a predetermined interval in a direction being orthogonal to the arrangement direction, and arranged such that positions at opposite ends of the first terminal connecting region 10 and positions at opposite ends of the second terminal connecting region 20 face each other; and, the first connector fixing region 12 and the second connector fixing region 22 are provided in at least a third region A3 of a first region A1, a second region A2, and the third region A3 lying between the first region A1 and the second region A2, wherein the first region A1 corresponds to a belt-like extended portion of the first terminal connecting region 10 extended along the arrangement direction on a plane of the wiring board 1, and the second region A2 corresponds to a belt-like extended portion of the second terminal connecting region 20 extended along the arrangement direction on the plane of the wiring board 1.

According to the above-described embodiment, a first terminal connecting region 10 and a second terminal connecting region 20 are arranged such that they are provided mutually parallel at a predetermined interval in a direction being orthogonal to the arrangement direction and the positions at the opposite ends of the first terminal connecting region 10 and the positions at the opposite ends of the second terminal connecting region 20 face each other. In this way, the connector CN1 is arranged at the same mounting position regardless of the mounting orientation of the connector CN1, making it possible to reduce the mounting space of the connector CN1. Moreover, the connector fixing regions 12 and 22 are provided in at least a third region A3 of a belt-like first region A1, a belt-like second region A2, and the third region A3 lying between the first and second regions A1, A2, making it possible to further reduce the mounting space of the connector CN1.

Moreover, in the electrical connection structure for the wiring board according to one embodiment, the first terminal connecting region or the second terminal connecting region are to be a single terminal connecting region 110 to which the plurality of terminals 42 of the connector CN1 is connected in both cases of the first mounting and the second mounting; and the first connector fixing region 112 and the second connector fixing region 122 are arranged at regions except a belt-like region being extended along a direction being orthogonal to the arrangement direction from the single terminal connecting region 110 on a plane of the wiring board 101, and located at the positions facing each other via a center line L1 of the single terminal connecting region 110 along a longitudinal direction of the single terminal connecting region 110.

The first connector fixing region and the second connector fixing region are respectively arranged at regions except a belt-like region being extended along a direction being orthogonal to the arrangement direction from the single terminal connecting region on a plane of the wiring board, wherein the first connector fixing region and the second connector fixing region are arranged so as to face each other via a center line of the single terminal connecting region along a longitudinal direction of the single terminal connecting region.

According to the above-described embodiment, in a case that a connector CN1 is mounted to a wiring board 101 in the orientation in which the inserting direction of a belt-like wiring material 50 is to be from the display panel end (in a case of a first mounting), a plurality of terminals 42 at the end being opposite to the display panel is connected to a single terminal connecting region 110 and a connector fixing terminal 43 is connected to one connector fixing region, which is located at the display panel end with respect to the single terminal connecting region 110, of a first connector fixing region 112 and a second connector fixing region 122.

On the other hand, in a case that the connector CN1 is mounted to the wiring board 101 in the orientation in which the inserting direction of the belt-like wiring material 50 is to be from the end being opposite to the display panel (in a case of a second mounting), the plurality of terminals 42 at the display panel end is connected to the single terminal connecting region 110 and the connector fixing terminal 43 is connected to the other connector fixing region, which is located at the end being opposite to the display panel with respect to the single terminal connecting region 110, of the first connector fixing region 112 and the second connector fixing region 122.

Moreover, in the electrical connection structure for the wiring board according to one embodiment, the belt-like wiring material 50 is a flexible wiring board or a flexible flat cable.

According to the above-described embodiment, connectors CN1 being mounted to mutually neighboring wiring boards 1, 101, respectively, in a plurality of wiring boards 1, 101 are electrically connected via a flexible wiring board (or a flexible flat cable) in which a plurality of wirings are lined up in a belt-like manner and the opposite ends of each wiring correspond to each other on a one-on-one basis. This makes it possible to maintain the corresponding relationships of the plurality of terminals 42 of both connectors CN1 even when the orientations of the connectors CN1 to be mounted to mutually neighboring wiring boards 1, 101, respectively, are reversed.

Moreover, a display apparatus according to the present invention comprises an electrical connection structure for the wiring board according to any one of the above-described structure; and a display panel 200, 300 to be driven by an electrical signal and/or power being distributed by the wiring board 1, 101.

According to the above-described configuration, by providing an electrical connection structure for a wiring board in which the inserting direction to a connector CN1 can be reversed, it is possible to deal with the reverse with one type of wiring board 1, 101, and the need to design and develop two types of wiring boards is eliminated, making it possible to reduce cost.

Moreover, in a display apparatus according to one embodiment, the display panel 200 is a flat panel comprising a panel surface 201 being planar;

the connector CN1 is mounted in an orientation in a case of the first mounting;

the belt-like wiring material 50a comprises a base portion 50a extending in the arrangement direction and two projecting portions 50b extending in a direction being orthogonal to longitudinal direction of the base portion 50a from opposite ends of the base portion 50a; and the base portion 50a of the belt-like wiring material 50 overlaps the wiring board 1, 101.

According to the above-described embodiment, narrow framing of a display apparatus using a flat panel can be realized.

Moreover, in a display apparatus according to one embodiment, the display panel 300 is a curved panel comprising a panel surface 301 being curved;

the connector CN1 is mounted in an orientation in a case of the second mounting;

the belt-like wiring material 50 comprises a base portion 50a extending in the arrangement direction and two projecting portions 50b extending in a direction being orthogonal to a longitudinal direction of the base portion 50a from opposite ends of the base portion 50a; and the base portion 50a of the belt-like wiring material 50 does not overlap the wiring board 1, 101.

The above-described embodiment makes it possible to deal with upsizing of a display apparatus using a curved panel.

DESCRIPTION OF REFERENCE NUMERAL 1, 101 . . . Printed wiring board
11, 21, 111 . . . Terminal connecting land
12, 22, 112, 122 . . . Connector fixing land (connector fixing region)
10 . . . First terminal connecting region
20 . . . Second terminal connecting region
31, 131 . . . Wiring pattern for electrical signal
32, 132 . . . Wiring pattern for power supply
33, 133 . . . Wiring pattern for electrical signal
41 . . . Connector body
42 . . . Plurality of terminals
43 . . . Connector fixing terminal
50 . . . FPC50 (belt-like wiring material)
50a . . . Base portion
50b . . . Projecting portion
110 . . . Terminal connecting region
200, 300 . . . Liquid crystal display panel (display apparatus)
CN1 . . . Connector

The invention claimed is:

1. An electrical connection structure for a wiring board, the electrical connection structure comprising:
  a plurality of wiring boards to distribute an electrical signal and/or power to drive a display panel, the plurality of wiring boards being arranged along one side of the display panel; and
  connectors being mounted to mutually neighboring wiring boards, respectively, of the plurality of wiring boards to electrically connect between the wiring boards via a belt-like wiring material, wherein
  the connector comprises:
  a connector body with an elongated shape having a longitudinal direction along an arrangement direction of the plurality of wiring boards;
  a plurality of terminals being arranged in the connector body along the longitudinal direction; and
  connector fixing terminals being provided at opposite ends of the connector body in the longitudinal direction,
  the wiring board comprises:
  a terminal connecting region to which the plurality of terminals of the connector is connected; and
  a connector fixing region to which the connector fixing terminals at opposite ends of the connector are connected, and
  the terminal connecting region and the connector fixing region are configured to enable both of a first mounting of the connector and a second mounting of the connector, wherein the first mounting of the connector has an orientation in which an inserting direction of the belt-like wiring material is to be from a display panel end, and the second mounting of the connector has an orientation in which the inserting direction of the belt-like wiring material is to be from an end being opposite to the display panel.

2. The electrical connection structure for a wiring board according to claim 1, wherein
the terminal connecting region comprises a first terminal connecting region to which the plurality of terminals of the connector is connected in a case of the first mounting and a second terminal connecting region to which the plurality of terminals of the connector is connected in a case of the second mounting;
the connector fixing region comprises a first connector fixing region to which the connector fixing terminals at the opposite ends of the connector are connected in the case of the first mounting and a second connector fixing region to which the connector fixing terminals at the opposite ends of the connector are connected in the case of the second mounting; and
the terminal connecting region and the connector fixing region are configured such that a minimum rectangular region comprising the first terminal connecting region and the first connector fixing region and a minimum rectangular region comprising the second terminal connecting region and the second connector fixing region overlap at least in a part.

3. The electrical connection structure for the wiring board according to claim 2, wherein
the first terminal connecting region and the second terminal connecting region are provided mutually parallel at a predetermined interval in a direction being orthogonal to the arrangement direction, and arranged such that positions at opposite ends of the first terminal connecting region and positions at opposite ends of the second terminal connecting region face each other; and,
the first connector fixing region and the second connector fixing region are provided in at least a third region of a first region, a second region, and the third region lying between the first region and the second region, wherein the first region corresponds to a belt-like extended portion of the first terminal connecting region extended along the arrangement direction on a plane of the wiring board, and the second region corresponds to a belt-like extended portion of the second terminal connecting region extended along the arrangement direction on the plane of the wiring board.

4. The electrical connection structure for the wiring board according to claim 2, wherein
the first terminal connecting region and the second terminal connecting region are to be a single terminal connecting region to which the plurality of terminals of the connector is connected in both cases of the first mounting and the second mounting; and
the first connector fixing region and the second connector fixing region are respectively arranged at regions except a belt-like region being extended along a direction being orthogonal to the arrangement direction from the single terminal connecting region on a plane of the wiring board, wherein the first connector fixing region and the second connector fixing region are arranged so as to face each other via a center line of the single terminal connecting region along a longitudinal direction of the single terminal connecting region.

5. The electrical connection structure for the wiring board according to claim 4, wherein the first connector fixing region and the second connector fixing region are arranged in a 180 degrees rotational symmetrical manner with respect to a center of the single terminal connecting region.

6. The electrical connection structure for the wiring board according to claim 1, wherein
the belt-like wiring material is a flexible wiring board or a flexible flat cable.

7. A display apparatus comprising:
the electrical connection structure for the wiring board according to claim 1; and
a display panel to be driven by an electrical signal and/or power being distributed by the wiring board.

8. The display apparatus according to claim 7, wherein
the display panel is a flat panel comprising a panel surface being planar;
the connector is mounted in an orientation in a case of the first mounting;
the belt-like wiring material comprises a base portion extending in the arrangement direction and two projecting portions extending in a direction being orthogonal to a longitudinal direction of the base portion from opposite ends of the base portion; and
the base portion of the belt-like wiring material overlaps the wiring board.

9. The display apparatus according to claim 7, wherein
the display panel is a curved panel comprising a panel surface being curved;
the connector is mounted in an orientation in a case of the second mounting;
the belt-like wiring material comprises a base portion extending in the arrangement direction and two projecting portions extending in a direction being orthogonal to a longitudinal direction of the base portion from opposite ends of the base portion; and
the base portion of the belt-like wiring material does not overlap the wiring board.

* * * * *